United States Patent
Kim et al.

(10) Patent No.: US 11,501,987 B2
(45) Date of Patent: Nov. 15, 2022

(54) LOADLOCK MODULE AND SEMICONDUCTOR MANUFACTURING APPARATUS INCLUDING THE SAME

(71) Applicant: Samsung Electronics Co., Ltd., Suwon-si (KR)

(72) Inventors: Kwang-nam Kim, Suwon-si (KR); Byeong-Hee Kim, Suwon-si (KR); Jeongryul Kim, Seoul (KR); Hae-Joong Park, Yongin-si (KR); Jong-Woo Sun, Hwaseong-si (KR); Sang-Rok Oh, Yongin-si (KR); Sung-Wook Jung, Seoul (KR); Nam-Young Cho, Suwon-si (KR); Jung-Pyo Hong, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 9 days.

(21) Appl. No.: 17/200,032

(22) Filed: Mar. 12, 2021

(65) Prior Publication Data

US 2021/0202283 A1    Jul. 1, 2021

Related U.S. Application Data

(63) Continuation of application No. 16/245,339, filed on Jan. 11, 2019, now Pat. No. 10,971,382.

(30) Foreign Application Priority Data

Jul. 16, 2018 (KR) .................. 10-2018-0082204

(51) Int. Cl.
   *H01L 21/67* (2006.01)
   *H01L 21/677* (2006.01)
   *H01L 21/673* (2006.01)

(52) U.S. Cl.
   CPC .. *H01L 21/67201* (2013.01); *H01L 21/67167* (2013.01); *H01L 21/67772* (2013.01);
   (Continued)

(58) Field of Classification Search
   CPC ......... H01L 21/67167; H01L 21/67201; H01L 21/67772; H01L 21/6775; H01L 21/67775
   See application file for complete search history.

(56) References Cited

U.S. PATENT DOCUMENTS

| 5,186,718 A | 2/1993 | Tepman |
| 6,168,672 B1 | 1/2001 | Nguyen |

(Continued)

FOREIGN PATENT DOCUMENTS

| JP | H06-333913 A | 12/1994 |
| JP | H08-124916 A | 5/1996 |

(Continued)

*Primary Examiner* — James Keenan
(74) *Attorney, Agent, or Firm* — Muir Patent Law, PLLC

(57) ABSTRACT

A semiconductor manufacturing apparatus includes a loadlock module including a loadlock chamber in which a substrate container is received, wherein the loadlock module is configured to switch an internal pressure of the loadlock chamber between atmospheric pressure and a vacuum; and a transfer module configured to transfer a substrate between the substrate container received in the loadlock chamber and a process module for performing a semiconductor manufacturing process on the substrate, wherein the loadlock module includes a purge gas supply unit configured to supply a purge gas into the substrate container through a gas supply line connected to the substrate container; and an exhaust unit configured to discharge a gas in the substrate container through an exhaust line connected to the substrate container.

17 Claims, 14 Drawing Sheets

(52) U.S. Cl.
CPC .. *H01L 21/67775* (2013.01); *H01L 21/67017* (2013.01); *H01L 21/67373* (2013.01)

(56) References Cited

U.S. PATENT DOCUMENTS

| | | | |
|---|---|---|---|
| 6,340,405 | B2 | 1/2002 | Park |
| 6,676,356 | B2 | 1/2004 | Saeki |
| 6,698,992 | B2 | 3/2004 | Wu |
| 7,927,058 | B2 | 4/2011 | Miyajima |
| 8,272,825 | B2 | 9/2012 | Hofmeister |
| 8,506,711 | B2 | 8/2013 | Lee |
| 10,510,566 | B2 | 12/2019 | Lin |
| 11,171,028 | B2 * | 11/2021 | Pannese ............ H01L 21/68707 |
| 2002/0015636 | A1 | 2/2002 | Lee |
| 2002/0044859 | A1 | 4/2002 | Lee |
| 2012/0083918 | A1* | 4/2012 | Yamazaki ......... H01L 21/67389 |
| | | | 700/112 |
| 2016/0147235 | A1* | 5/2016 | Rice ................. H01L 21/67775 |
| | | | 700/282 |
| 2017/0025290 | A1 | 1/2017 | Wakabayashi |
| 2018/0114710 | A1* | 4/2018 | Jeong ................ H01L 21/67201 |
| 2018/0155834 | A1 | 6/2018 | Srinivasan |
| 2019/0019719 | A1 | 1/2019 | Atwood |

FOREIGN PATENT DOCUMENTS

| | | |
|---|---|---|
| JP | H08-115968 A | 7/1996 |
| JP | H10-256352 A | 9/1998 |
| JP | 2001035904 A | 2/2001 |
| JP | 2005-051171 A | 2/2005 |
| JP | 4264196 A | 5/2009 |
| JP | 2011-089174 A | 5/2011 |
| JP | 2014-103298 A | 6/2014 |
| JP | 2017-028158 A | 2/2017 |
| KR | 1020020017075 A | 3/2002 |
| KR | 10-2008-0107719 A | 12/2008 |
| KR | 10-1088495 B1 | 11/2011 |
| KR | 10-2013-0125161 A | 11/2013 |
| KR | 1020170012031 A | 2/2017 |
| WO | 2012/008439 A1 | 9/2013 |

* cited by examiner

LOADLOCK MODULE AND SEMICONDUCTOR MANUFACTURING APPARATUS INCLUDING THE SAME

CROSS-REFERENCE TO RELATED APPLICATION

This application is a continuation of and claims priority to U.S. patent application Ser. No. 16/245,339 filed on Jan. 11, 2019, which claims the benefit of Korean Patent Application No. 10-2018-0082204, filed on Jul. 16, 2018, in the Korean Intellectual Property Office, the disclosure of each of which is incorporated herein in their entirety by reference.

BACKGROUND

The inventive concept relates to a loadlock module and a semiconductor manufacturing apparatus including the same.

As semiconductor devices have recently been highly integrated and circuits have recently been miniaturized, in order to prevent the yield of semiconductor products from being reduced due to contamination of wafers due to exposure to external environments during semiconductor manufacturing processes, there is demand for semiconductor manufacturing equipment to maintain a high level of cleanliness. In order to meet the demand, in general, semiconductor manufacturing equipment includes a load port on which a wafer carrier called a front opening unified pod (FOUP) is placed, an equipment front end module (EFEM) maintained at a high level of cleanliness, a loadlock module configured to temporarily receive a wafer and having an internal pressure adjusted between atmospheric pressure and a vacuum, a transfer module configured to transfer the wafer, and a process module configured to perform a semiconductor manufacturing process on the wafer.

SUMMARY

The inventive concept provides a loadlock module and a semiconductor manufacturing apparatus including the same.

According to an aspect of the inventive concept, provided is a semiconductor manufacturing apparatus including: a loadlock module including a loadlock chamber in which a substrate container is received, wherein the loadlock module is configured to switch an internal pressure of the loadlock chamber between atmospheric pressure and a vacuum; and a transfer module configured to transfer a substrate between the substrate container received in the loadlock chamber and a process module for performing a semiconductor manufacturing process on the substrate, wherein the loadlock module includes: a purge gas supply unit configured to supply a purge gas into the substrate container through a gas supply line connected to the substrate container; and an exhaust unit configured to discharge a gas in the substrate container through an exhaust line connected to the substrate container.

According to another aspect of the inventive concept, provided is a semiconductor manufacturing apparatus including: a loadlock module including a loadlock chamber in which a substrate container is received, wherein the loadlock module is configured to switch an internal pressure of the loadlock chamber between atmospheric pressure and a vacuum; a transfer module configured to transfer a substrate between the substrate container received in the loadlock chamber and a process module for performing a semiconductor manufacturing process on the substrate; and a buffer module connected to the transfer module, wherein the buffer module is configured to temporarily receive the substrate on which the semiconductor manufacturing process performed by the process module is completed and purify the substrate in a vacuum.

According to another aspect of the inventive concept, provided is a loadlock module including: a chamber in which a substrate container configured to accommodate a plurality of substrates is received; a stage provided in the chamber, wherein the stage is configured to support the substrate container; a first purge gas supply unit configured to supply a purge gas into the chamber; a first exhaust unit configured to discharge a gas in the chamber; a second purge gas supply unit configured to supply a purge gas into the substrate container through a gas supply line connected to the substrate container; and a second exhaust unit configured to discharge a gas in the substrate container through an exhaust line connected to the substrate container.

According to another aspect of the inventive concept, provided is a method of processing a substrate, the method including: loading a substrate container accommodating a substrate onto a loadlock module; switching an internal pressure of the substrate container and an internal pressure of a loadlock chamber of the loadlock module from an atmospheric pressure to a vacuum; separating a cover of the substrate container from a main body of the substrate container; transferring the substrate accommodated in the substrate container to a process module; performing a semiconductor manufacturing process on the substrate; transferring the substrate on which the semiconductor manufacturing process is completed into the substrate container; mounting the cover of the substrate container on the main body to close the opening of the substrate container; switching the internal pressure of the substrate container and the internal pressure of the loadlock chamber from a vacuum to atmospheric pressure; and unloading the substrate container from the loadlock module.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
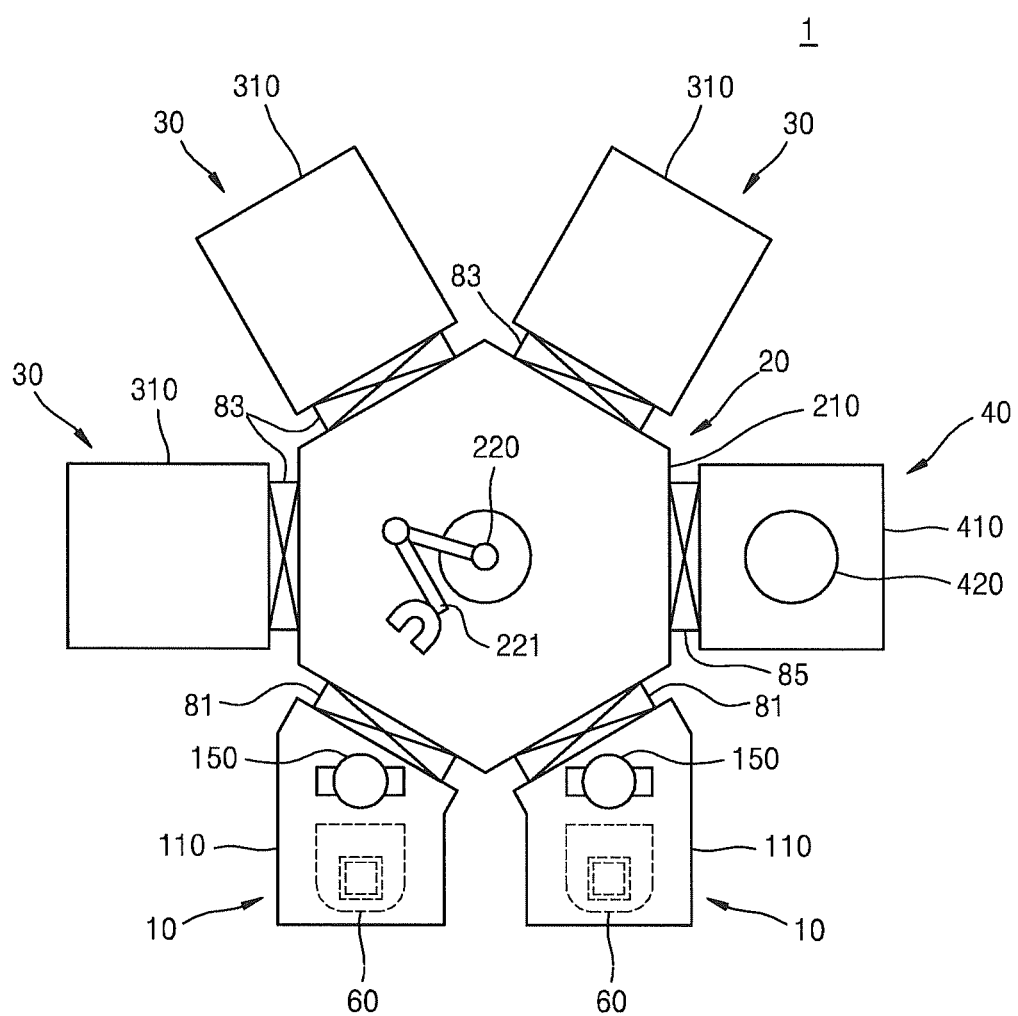
FIG. 1 is a view illustrating a configuration of a semiconductor manufacturing apparatus according to embodiments.

The inventive concept will now be described more fully with reference to the accompanying drawings, in which embodiments of the inventive concept are shown. In the drawings, the same elements are denoted by the same reference numerals, and thus a repeated explanation thereof will not be given.

FIG. 1 is a view illustrating a configuration of a semiconductor manufacturing apparatus 1 according to embodiments.

Referring to FIG. 1, the semiconductor manufacturing apparatus 1 may include a loadlock module 10, a transfer module 20, a process module 30, and a buffer module 40. For example, the semiconductor manufacturing apparatus 1 may be a multi-chamber substrate processing system including the transfer module 20 including a substrate transfer robot 220, the loadlock module 10, the process module 30, and the buffer module 40. The loadlock module 10, the process module 30, and the buffer module 40 may be provided around the transfer module 20.

The loadlock module 10 may include a loadlock chamber 110 having an inner space in which a substrate container 60 is received. The substrate container 60 may be directly loaded in the loadlock chamber 110, may remain in the loadlock module 10 while a semiconductor manufacturing process is performed on a substrate, and may be unloaded from the loadlock module 10 after the substrate on which the semiconductor manufacturing process is completed is accommodated in the substrate container 60.

The substrate container 60 is a container in which semiconductor substrates such as wafers are accommodated, and a sealed front opening unified pod (FOUP) may be used as the substrate container 60 to prevent the substrates from being contaminated with a foreign material or a chemical pollutant in air while the substrates are transferred. The substrate container 60 may include a cover 620 (see FIG. 3) detachably mounted on a main body 610 (see FIG. 3) of the substrate container 60 to open/close an opening through which the substrate is transferred.

The loadlock module 10 may adjust pressure within, i.e., an internal pressure of, the loadlock chamber 110. For example, the loadlock module 10 may adjust the internal pressure of the loadlock chamber 110 between atmospheric pressure and a vacuum. It will be appreciated that a "vacuum" may describe a pressure less than, and in some embodiments, much less than, atmospheric pressure (about 760 Torr). According to example embodiments, a vacuum may describe a pressure of, for example, 10 Torr or less, 10–1 Torr or less, or 10–3 Torr or less.

For example, while the substrate container 60 is loaded in or unloaded from the loadlock chamber 110, the loadlock module 10 may adjust the internal pressure of the loadlock chamber 110 to atmospheric pressure so that the internal pressure of the loadlock chamber 110 is balanced with an external pressure. The loadlock chamber 110 may adjust the internal pressure of the loadlock chamber 110 to atmospheric pressure before a door 115 (see FIG. 2A) for opening/closing an opening 113 (see FIG. 2A) of the loadlock chamber 110 is opened, thereby preventing external air from suddenly flowing into an inner space 111 (see FIG. 2A) of the loadlock chamber 110 when the door 115 is opened.

Also, when the substrate is transferred between the transfer module 20 and the substrate container 60 received in the loadlock chamber 110, the loadlock module 10 may adjust the internal pressure of the loadlock chamber 110 to a vacuum.

An entrance gate 81 for opening/closing a passage through which a transfer arm 221 that holds the substrate may pass may be provided between the loadlock module 10 and the transfer module 20. The entrance gate 81 may connect or separate the inside of the loadlock chamber 110 and the inside of a transfer chamber 210 of the transfer module 20. Before the entrance gate 81 is opened, the loadlock module 10 may adjust the internal pressure of the loadlock chamber 110 to a vacuum. In this case, the internal pressure, i.e., the vacuum within the loadlock chamber 110 may be adjusted to be close to the internal pressure of the transfer chamber 210 of the transfer module 20. Since the internal pressure of the loadlock chamber 110 is adjusted to be close to an internal pressure of the transfer chamber 210, a pressure state of the transfer chamber 210 may be prevented from being changed when the entrance gate 81 is opened.

The transfer module 20 may transfer the substrate between the buffer module 40, the process module 30, and the substrate container 60 received in the loadlock module 10. The transfer module 20 may be a vacuum transfer module for transferring the substrate in a vacuum.

The transfer module 20 may include the transfer chamber 210 having a vacuum within, and the substrate transfer robot 220 provided in the transfer chamber 210, wherein the transfer module 20 is configured to transfer the substrate. The substrate transfer robot 220 may include the transfer arm 221 for holding the substrate. For example, when the entrance gate 81 provided between the transfer module 20 and the loadlock module 10 is opened, the transfer arm 221 of the substrate transfer robot 220 may enter the substrate container 60 and may take the substrate out from the substrate container 60 or may carry the substrate into the substrate container 60.

The process module 30 may perform a semiconductor manufacturing process on the substrate. An entrance gate 83 for opening/closing a passage through which the transfer arm 221 that holds the substrate may pass may be provided between the process module 30 and the transfer module 20. The process module 30 may include a plurality of process chambers 310 arranged on a side wall of the transfer module 20. The process module 30 may be, but is not limited to, dry etch equipment, chemical vapour deposition (CVD) equipment, a thermal furnace, developing equipment, or cleaning equipment.

The buffer module 40 may temporarily receive the substrate on which the semiconductor manufacturing process performed by the process module 30 is completed and may purify the substrate. The buffer module 40 may include a buffer chamber 410, and a buffer stage 420 on which the substrate on which the semiconductor manufacturing process is completed is placed. An entrance gate 85 for opening/closing a passage through which the transfer arm 221 that holds the substrate may pass may be provided between the process module 30 and the buffer module 40. However, in some embodiments, the entrance gate 85 may be omitted.

Also, the buffer module 40 may include an exhaust device for discharging a gas in an inner space of the buffer chamber 410 to form a vacuum in the buffer chamber 410. A vacuum may be formed in the buffer chamber 410 due to the exhaust device. The buffer module 40 may remove a gas emitted through outgassing from the substrate on which the semiconductor manufacturing process is completed by forming a vacuum in the buffer chamber 410. Furthermore, since the vacuum is formed in the buffer chamber 410, the substrate may be prevented from being contaminated with a contaminant generated when a gas remaining on the substrate is mixed with moisture or a foreign material is adsorbed on the substrate.

In embodiments, the buffer stage 420 may include a storage in which a plurality of substrates may be simultaneously loaded.

In embodiments, the buffer module 40 may be configured to inject a purge gas to the substrate placed on the buffer stage 420.

In embodiments, the buffer module 40 may adjust an internal pressure of the buffer chamber 410 so that the internal pressure of the buffer chamber 410 is lower than the internal pressure of the transfer chamber 210. Since the internal pressure of the buffer chamber 410 is lower than the internal pressure of the transfer chamber 210, airflow from the transfer chamber 210 toward the buffer chamber 410 may be formed. Since the airflow from the transfer chamber 210 toward the buffer chamber 410 is formed, a contaminant such as a gas generated through outgassing from the substrate received in the buffer chamber 410 may be discharged to the outside, without flowing to the transfer chamber 210.

Also, the semiconductor manufacturing apparatus 1 may include a controller 50 (see FIG. 3) for controlling operations of the loadlock module 10, the transfer module 20, the process module 30, and the buffer module 40. Examples of the controller 50 may include a general personal computer (PC), a workstation, and a supercomputer.

In the semiconductor manufacturing apparatus 1 of the inventive concept, since the substrate container 60 may be directly loaded in the loadlock module 10, the footprint of the semiconductor manufacturing apparatus 1 may be greatly reduced and productivity may be improved.

Figure 2A:
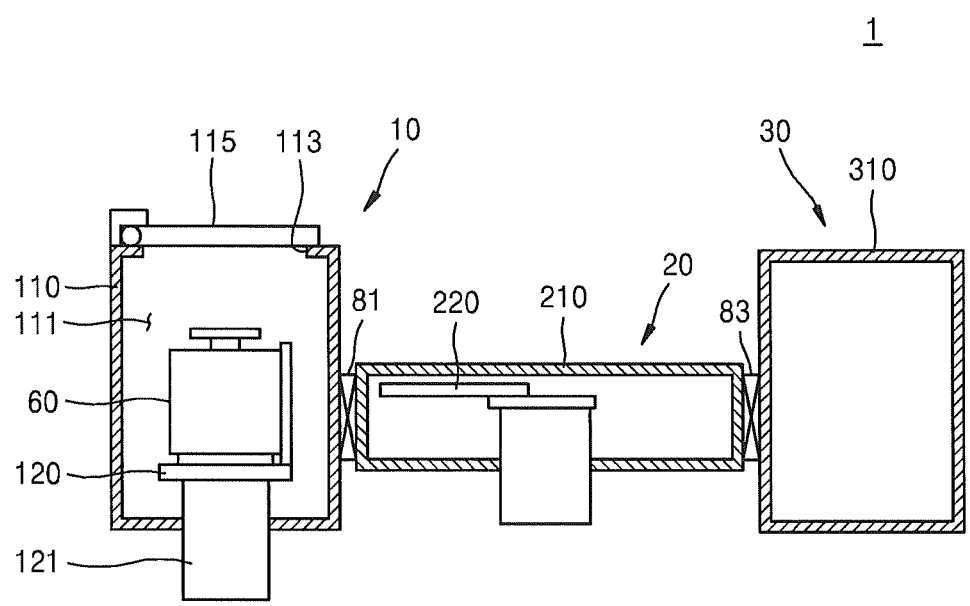
FIGS. 2A and 2B are cross-sectional views of the semiconductor manufacturing apparatus according to embodiments.
Figure 2B:
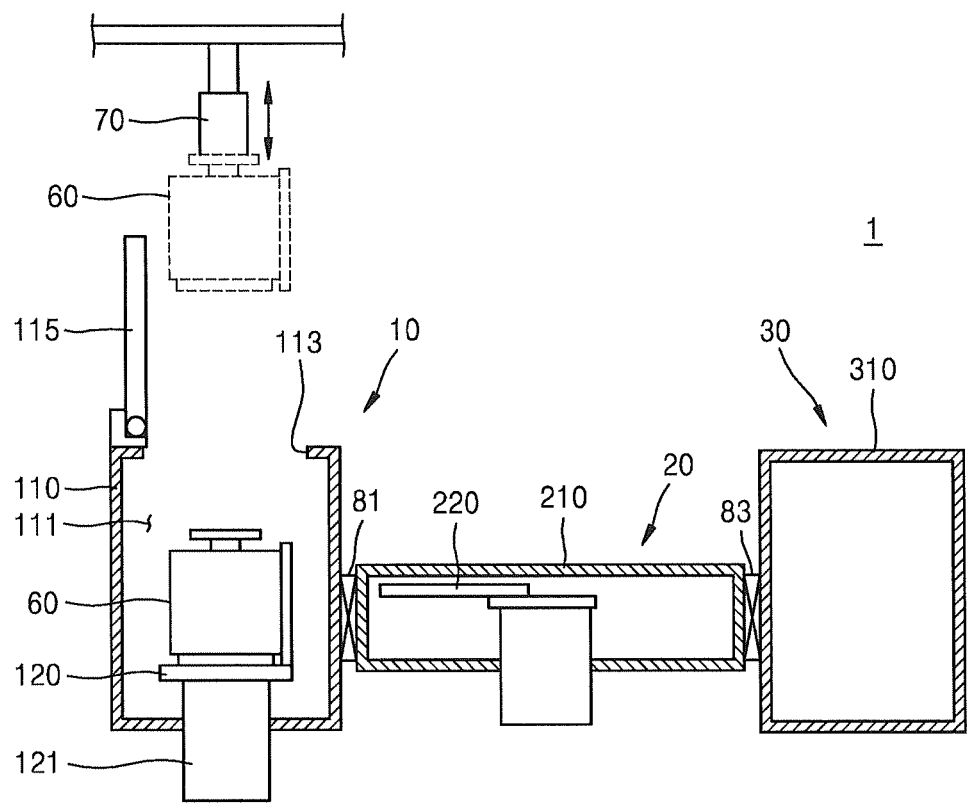

FIGS. 2A and 2B are cross-sectional views of the semiconductor manufacturing apparatus 1 according to embodiments. FIG. 2A illustrates a state where the opening 113 of the loadlock chamber 110 is closed by the door 115. FIG. 2B illustrates a state where the opening 113 of the loadlock chamber 110 is opened.

Referring to FIGS. 2A and 2B, the loadlock chamber 110 may include the door 115 configured to open/close the opening 113 through which the substrate container 60 is transferred. The door 115 may open the opening 113 of the loadlock chamber 110 so that the substrate container 60 may pass through the opening 113 when the substrate container 60 is loaded or unloaded. Also, the door 115 may close the opening 113 of the loadlock chamber 110 to isolate the inner space 111 of the loadlock chamber 110 from the outside.

As shown in FIG. 2B, the substrate container 60 may be loaded on or unloaded from the loadlock chamber 110 by a transfer mechanism 70 such as an overhead hoist transport system. That is, the transfer mechanism 70 may hold the substrate container 60, and may carry the substrate container 60 into the loadlock chamber 110 or may take the substrate container 60 out from the loadlock chamber 110.

In detail, in order to load the substrate container 60, the door 115 may open the opening 113 of the loadlock chamber 110, and the transfer mechanism 70 may lower the substrate container 60 and may release the substrate container 60 so that the substrate container 60 is placed on a stage 120 in the loadlock chamber 110. Also, in order to unload the substrate container 60, the door 115 may open the opening 113 of the loadlock chamber 110, and the transfer mechanism 70 may hold the substrate container 60 placed on the stage 120 in the loadlock chamber 110 and may raise the substrate container 60 so that the substrate container 60 is taken out from the loadlock chamber 110.

Figure 3:
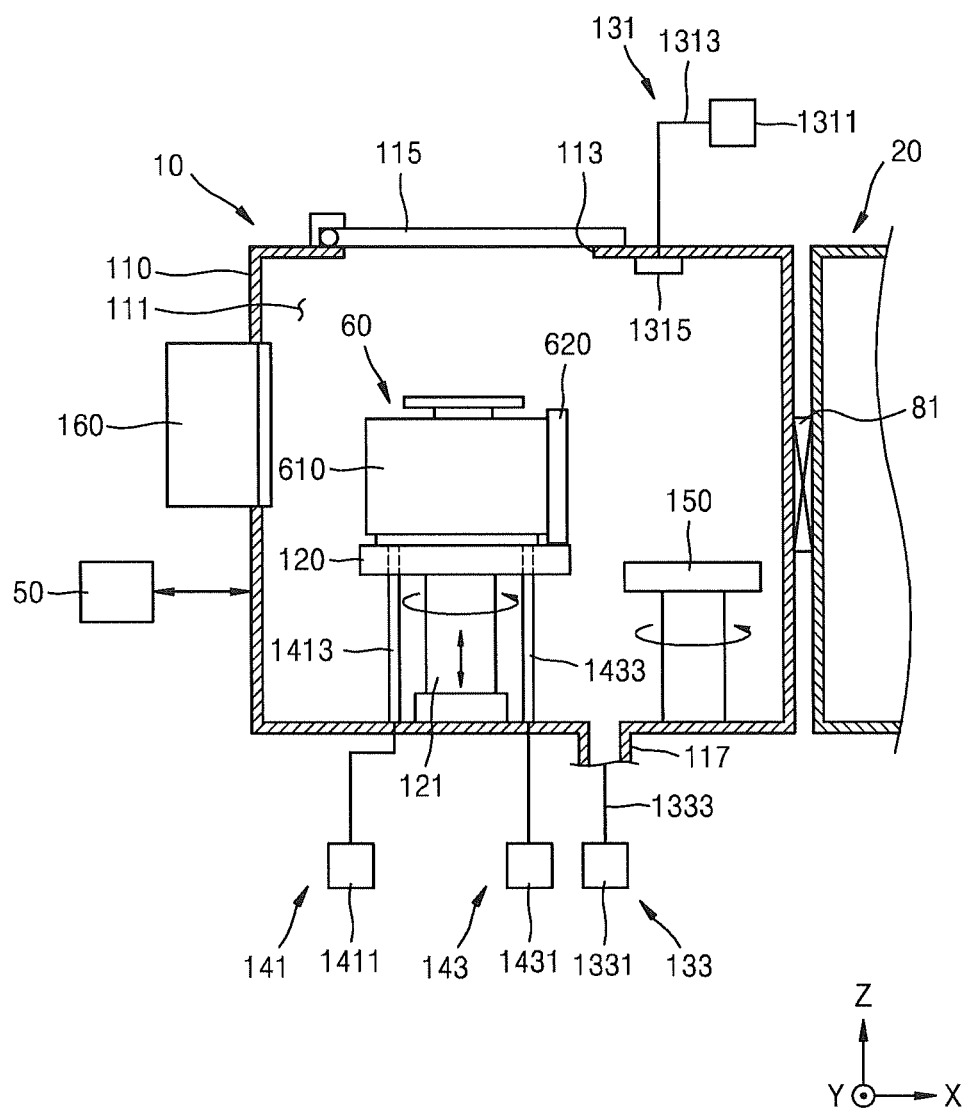
FIG. 3 is a cross-sectional view of a loadlock module according to embodiments.

FIG. 3 is a cross-sectional view of the loadlock module 10 according to embodiments.

Referring to FIG. 3, the loadlock module 10 may include the loadlock chamber 110, the stage 120, a substrate aligner 150, a cover holder 160, a first purge gas supply unit 131, a first exhaust unit 133, a second purge gas supply unit 141, and a second exhaust unit 143.

The loadlock chamber 110 may have the inner space 111 in which the substrate container 60 for accommodating a plurality of substrates may be received. In embodiments, a protective layer for preventing a foreign material such as particles from being attached to an inner surface of the loadlock chamber 110 may be provided on the inner surface of the loadlock chamber 110. Also, the loadlock chamber 110 may include a heating unit configured to heat a chamber wall to remove a foreign material attached to the chamber wall from the chamber wall.

The stage 120 may be provided in the loadlock chamber 110 and may support the substrate container 60 received in the loadlock chamber 110. The stage 120 may be configured to fix the substrate container 60 and move the substrate container 60 in the loadlock chamber 110.

The stage 120 may be connected to a stage driver 121 and may be moved by the stage driver 121 to move the substrate container 60 in the loadlock chamber 110. The stage 120 may be configured to be horizontally moved (e.g., in an X direction or a Y direction), be vertically moved (e.g., in a Z direction), and/or be rotated (e.g., about the Z-axis) in the loadlock chamber 110 by the stage driver 121.

The substrate aligner 150 may be provided in the loadlock chamber 110 and may align a substrate. The substrate aligner 150 may align the substrate so that the substrate is located in a preset direction, before the substrate is transferred to a process module. That is, the substrate aligner 150 may detect a crystal orientation of the substrate, and may align the substrate so that the detected crystal orientation is the preset direction. Also, the substrate aligner 150 may inspect a defect of the substrate.

In general, assuming that an aligner for aligning the substrate is provided in the transfer module 20, when the aligner is damaged or abnormally operates, the transfer module 20 that is a common portion of equipment has to be stopped for the maintenance of the aligner, and thus, the entire equipment has to be stopped. However, in embodiments, since the substrate aligner 150 is provided in the loadlock chamber 110, the maintenance of the substrate aligner 150 may be performed by stopping only the loadlock chamber 110 in which the substrate aligner 150 to be repaired is provided, without having to stop the entire equipment.

In embodiments, the substrate aligner 150 may be provided between the stage 120 that supports the substrate container 60 and a side surface of the loadlock chamber 110 that contacts the transfer module 20. For example, the substrate aligner 150 may be located between the entrance gate 81 and the stage 120. When the aligner for aligning the substrate is provided in an additional chamber provided at a side of the transfer module 20, a transfer path of the substrate from the loadlock module 10 to the process module 30 may be increased. However, in embodiments, since the substrate aligner 150 is located between the entrance gate 81 and the stage 120, a transfer path of the substrate from the loadlock module 10 to the process module 30 may be further reduced.

The cover holder 160 may separate the cover 620 of the substrate container 60 from the main body 610 of the substrate container 60 or may mount the cover 620 of the substrate container 60 on the main body 610. Also, the cover holder 160 may support the cover 620 separated from the main body 610 of the substrate container 60. In embodiments, the cover holder 160 may mechanically fix the cover 620 of the substrate container 60.

For example, a process by which the cover holder 160 separates the cover 620 from the main body 610 of the substrate container 60 will now be described.

Figure 4:
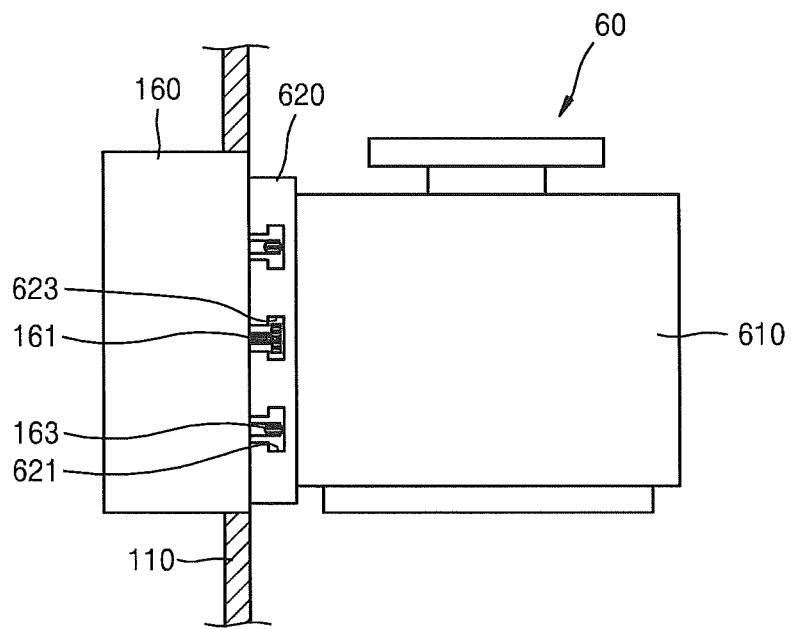
FIGS. 4 through 7 are views for describing a cover holder according to embodiments.

First, when the cover 620 of the substrate container 60 is closely attached to the cover holder 160 by moving the stage 120, the cover holder 160 drives a cover locking device of the substrate container 60 so that the cover 620 is in an unlock state where the cover 620 is separable from the main body 610 by using a latch key 161 (see FIG. 4). The cover holder 160 may fix the cover 620 that is unlocked. Since the cover 620 that is unlocked is fixed to the cover holder 160, the cover 620 may be separated from the main body 610 of the substrate container 60 as the main body 610 of the substrate container 60 is moved away from the cover holder 160 by the stage 120.

Also, for example, a process by which the cover holder 160 mounts the cover 620 on the main body 610 will now be described.

First, the stage 120 moves the main body 610 so that the main body 610 of the substrate container 60 contacts the cover 620 fixed to the cover holder 160. When the main body 610 contacts the cover 620 fixed to the cover holder 160, the cover holder 160 releases the cover 620 so that the cover 620 is separable from the cover holder 160. When the cover 620 is separable from the cover holder 160, the cover holder 160 may drive the cover locking device of the substrate container 60 so that the cover 620 is in a lock state where the cover 620 is mounted on the main body 610 by using the latch key 161.

The first purge gas supply unit 131 may supply a purge gas into the loadlock chamber 110. The first purge gas supply unit 131 may adjust an internal pressure of the loadlock chamber 110 by supplying the purge gas into the loadlock chamber 110. For example, the first purge gas supply unit 131 may adjust the internal pressure of the loadlock chamber 110 so that the internal pressure of the loadlock chamber 110 is balanced with a pressure (e.g., an atmospheric pressure) outside the loadlock chamber 110.

The first purge gas supply unit 131 may include a first purge gas supply source 1311 and a first gas supply line 1313. The first gas supply line 1313 may extend between the first purge gas supply source 1311 and the loadlock chamber 110 and may supply the purge gas of the first purge gas supply source 1311 to the loadlock chamber 110. A diffuser 1315 connected to one end of the first gas supply line 1313 may be provided in the loadlock chamber 110 and may diffuse the purge gas into the loadlock chamber 110.

The first purge gas supply unit 131 may include a first purge gas supply source 1311 and a first gas supply line 1313. The first gas supply line 1313 may extend between the first purge gas supply source 1311 and the loadlock chamber 110 and may supply the purge gas of the first purge gas supply source 1311 to the loadlock chamber 110. A diffuser connected to one end of the first gas supply line 1313 may be provided in the loadlock chamber 110 and may diffuse the purge gas into the loadlock chamber 110.

The first exhaust unit 133 may discharge a gas in the loadlock chamber 110. The first exhaust unit 133 may adjust the internal pressure of the loadlock chamber 110 by discharging the gas in the loadlock chamber 110. For example, the first exhaust unit 133 may evacuate the loadlock chamber 110 of gas so that the internal pressure of the loadlock chamber 110 becomes a vacuum. The first exhaust unit 133 may adjust the internal pressure of the loadlock chamber 110 so that the internal pressure of the loadlock chamber 110 is balanced with an internal pressure of the transfer chamber 210.

For example, the first exhaust unit 133 may reduce the internal pressure of the loadlock chamber 110 to 10 Torr or less, $10^{-1}$ Torr or less, or $10^{-3}$ Torr or less.

The first exhaust unit 133 may discharge particles in the loadlock chamber 110 to the outside by discharging the gas in the loadlock chamber 110. For example, the first exhaust unit 133 may discharge the gas in the loadlock chamber 110 through an exhaust port 117 formed at the bottom of the loadlock chamber 110. In this case, the purge gas diffused by the diffuser 1315 may downwardly flow toward the exhaust port 117, and a foreign material such as the particles in the loadlock chamber 110 may move along with the purge gas and may be discharged to the outside through the exhaust port 117.

For example, the first exhaust unit 133 may include a first vacuum pump 1331 and a first exhaust line 1333. The first exhaust line 1333 may extend between the first vacuum pump 1331 and the exhaust port 117 of the loadlock chamber 110.

The second purge gas supply unit 141 may supply a purge gas into the substrate container 60 placed on the stage 120. The second purge gas supply unit 141 may adjust an internal pressure of the substrate container 60 by supplying the purge gas into the substrate container 60. For example, when the internal pressure of the loadlock chamber 110 is switched from a vacuum to atmospheric pressure, the second purge gas supply unit 141 may adjust the internal pressure of the substrate container 60 so that the internal pressure of the substrate container 60 is balanced with the internal pressure of the loadlock chamber 110.

For example, the second purge gas supply unit 141 may supply a nitrogen gas, an inert gas, and/or clean dry air into the substrate container 60.

For example, the second purge gas supply unit 141 may include a second purge gas supply source 1411 and a second gas supply line 1413. The second gas supply line 1413 may extend between the second purge gas supply source 1411 and the substrate container 60 and may be connected to a gas inlet hole of the substrate container 60. In embodiments, the second gas supply line 1413 may be placed on the stage 120 to pass through the stage 120 and communicate with the gas inlet hole of the substrate container 60 placed on the stage 120.

The second exhaust unit 143 may discharge a gas in the substrate container 60. The second exhaust unit 143 may adjust the internal pressure of the substrate container 60 by discharging the gas in the substrate container 60. For example, the second exhaust unit 143 may evacuate the substrate container 60 of gas so that the internal pressure of the substrate container 60 becomes a vacuum. For example, the second exhaust unit 143 may adjust the internal pressure of the substrate container 60 so that the internal pressure of the substrate container 60 is balanced with the internal pressure of the loadlock chamber 110.

For example, the second exhaust unit 143 may reduce the internal pressure of the substrate container 60 to 10 Torr or less, $10^{-1}$ Torr or less, or $10^{-3}$ Torr or less.

Also, the second exhaust unit 143 may discharge particles in the substrate container 60 to the outside by discharging the gas in the substrate container 60. For example, a gas emitted through outgassing from the substrate on which a semiconductor manufacturing process is completed may be discharged to the outside by the second exhaust unit 143.

For example, the second exhaust unit 143 may include a second vacuum pump 1431 and a second exhaust line 1433. The second exhaust line 1433 may extend between the second vacuum pump 1431 and the substrate container 60 and may be connected to a gas outlet hole of the substrate container 60. In embodiments, the second exhaust line 1433 may be mounted in the stage 120 to pass through the stage 120 and communicate with the gas outlet hole of the substrate container 60 placed on the stage 120.

In embodiments, the adjusting of the internal pressure of the substrate container 60 by the second purge gas supply unit 141 and the adjusting of the internal pressure of the substrate container 60 by the second exhaust unit 143 may be performed in a state where the cover 620 of the substrate container 60 is mounted on the main body 610. That is, the internal pressure of the substrate container 60 may be adjusted in a state where an inner space of the substrate container 60 is separated from the inner space 111 of the loadlock chamber 110.

Since the internal pressure of the substrate container 60 is adjusted in a state where the inner space of the substrate container 60 is separated from the inner space 111 of the loadlock chamber 110, the internal pressure of the substrate container 60 may be independently adjusted by the second purge gas supply unit 141 and the second exhaust unit 143. That is, the first purge gas supply unit 131 and the first exhaust unit 133 may adjust the internal pressure of the loadlock chamber 110, and the second purge gas supply unit 141 and the second exhaust unit 143 may adjust the internal pressure of the substrate container 60.

The controller 50 may detect the internal pressure of the loadlock chamber 110 and the internal pressure of the substrate container 60. The controller 50 may control the first purge gas supply unit 131 and/or the first exhaust unit 133 to adjust the internal pressure of the loadlock chamber 110 and may control the second purge gas supply unit 141 and/or the second exhaust unit 143 to adjust the internal pressure of the substrate container 60.

In embodiments, while the internal pressure of the loadlock chamber 110 is switched from a vacuum to atmospheric pressure, the controller 50 may control the second purge gas supply unit 141 so that the internal pressure of the substrate container 60 is balanced with the internal pressure of the loadlock chamber 110. Also, while the internal pressure of the loadlock chamber 110 is shifted from atmospheric pressure to a vacuum, the controller 50 may control the second exhaust unit 143 so that the internal pressure of the substrate container 60 is balanced with the internal pressure of the loadlock chamber 110.

Since the internal pressure of the substrate container 60 is changed to be balanced with the internal pressure of the loadlock chamber 110, a pressure difference between the internal pressure of the substrate container 60 and the internal pressure of the loadlock chamber 110 may be very small. Accordingly, the substrate container 60 may be prevented from being deformed due to a pressure difference between the internal pressure of the substrate container 60 and the internal pressure of the loadlock chamber 110.

Figure 5:
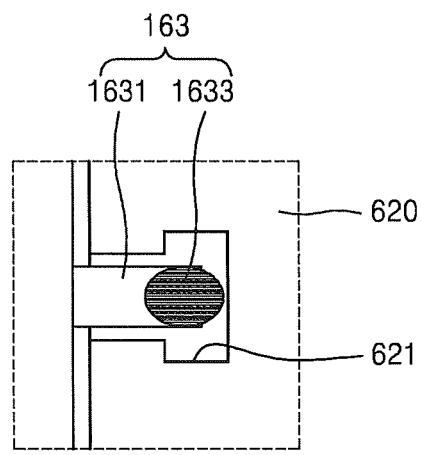
Figure 6:
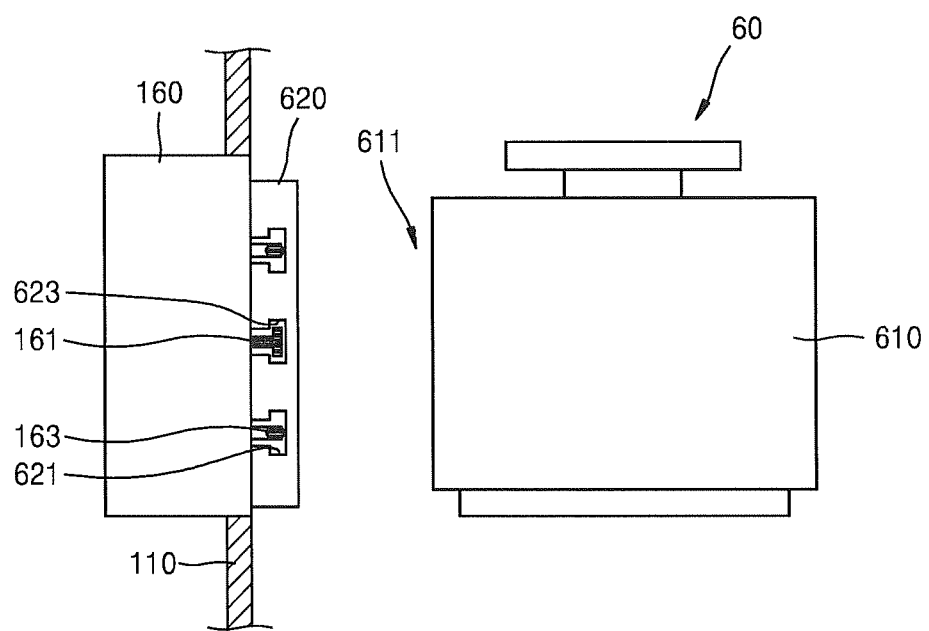
Figure 7:
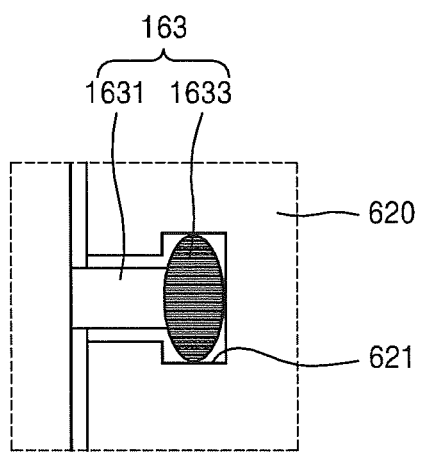

FIGS. 4 through 7 are views for describing the cover holder 160 according to embodiments. FIG. 4 is a view illustrating a state where the cover 620 of the substrate container 60 is separable from the cover holder 160. FIG. 5 is an enlarged view illustrating a part of FIG. 4. FIG. 6 is a view illustrating a state where the cover 620 of the substrate container 60 is fixed to the cover holder 160. FIG. 7 is an enlarged view illustrating a part of FIG. 6.

Referring to FIGS. 4 through 7, the cover holder 160 may include the latch key 161 for driving a cover locking device of the substrate container 60 and a supporter 163 for supporting the substrate container 60.

The latch key 161 may be inserted into a key hole 623 formed in the cover 620 of the substrate container 60. Since the latch key 161 rotates in a state where the latch key 161 is inserted into the key hole 623, the cover 620 may drive the cover locking device of the substrate container 60 between a lock state where the cover 620 is mounted on the main body 610 and an unlock state where the cover 620 is separable from the main body 610.

The supporter 163 may include a post 1631 that is inserted into a groove 621 formed in the cover 620 of the substrate container 60 and a fixed pad 1633 mounted on the post 1631. The fixed pad 1633 may be configured to expand or contract. For example, the fixed pad 1633 may have a space in which air may be injected, and a volume of the fixed pad 1633 may be increased by injecting air and may be reduced by discharging air.

As shown in FIGS. 4 and 5, the cover holder 160 may cause the fixed pad 1633 to contract so that the cover 620 of the substrate container 60 is separable from the cover holder 160. As the fixed pad 1633 contracts, the fixed pad 1633 may be separated from the groove 621 of the cover 620, and the cover 620 mounted on the main body 610 of the substrate container 60 may freely move without being fixed to the supporter 163.

As shown in FIGS. 6 and 7, the cover holder 160 may cause the fixed pad 1633 to expand so that the cover 620 of the substrate container 60 is fixed to the cover holder 160. As the fixed pad 1633 expands, the fixed pad 1633 may be closely fixed to the groove 621 of the cover 620, and the cover 620 of the substrate container 60 may be fixed to the supporter 163. As the stage 120 moves the main body 610 of the substrate container 60 away from the cover holder 160, the cover 620 of the substrate container 60 may be separated from the main body 610 and the cover 620 may be fixed to the cover holder 160.

Figure 8:
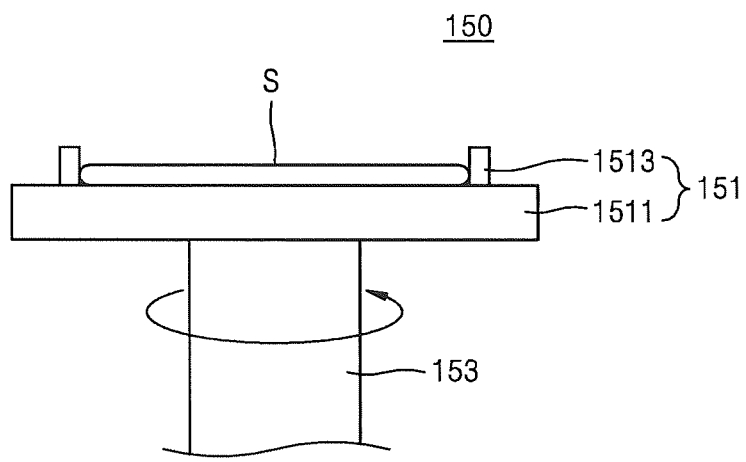
FIG. 8 is a view for describing a substrate aligner according to embodiments.

FIG. 8 is a view for describing the substrate aligner 150 according to embodiments.

Referring to FIG. 8, the substrate aligner 150 may include a substrate chuck 151 for fixing a substrate S and a chuck driver 153 for rotating the substrate chuck 151.

The substrate chuck 151 may mechanically fix the substrate S. In embodiments, the substrate chuck 151 may include a base 1511 on which the substrate S is placed and a substrate clamp 1513 for supporting the substrate S placed on the base 1511.

For example, a process by which the substrate aligner 150 aligns the substrate S will now be described. First, the substrate transfer robot 220 of the transfer module 20 transfers the substrate S of the substrate container 60 to the base 1511. When the substrate S is placed on the base 1511 by the substrate transfer robot 220, the substrate clamp 1513 may contact and support the substrate S. When the substrate S is fixed by the substrate clamp 1513, the substrate aligner 150 may detect a crystal orientation of the substrate S, and may rotate the substrate chuck 151 so that the detected crystal orientation is a preset direction. When the aligning of the substrate S is completed, the substrate clamp 1513 may release the substrate S, and the substrate transfer robot 220 may transfer the aligned substrate S to the process module 30.

In embodiments, the substrate S may be aligned by the substrate aligner 150 in the loadlock chamber 110 containing a vacuum therein. In this case, it may be difficult to fix the substrate S by using a vacuum absorption method in a vacuum. However, in embodiments, since the substrate aligner 150 may mechanically fix the substrate S, the substrate aligner 150 may stably fix the substrate S even in a vacuum.

Figure 9:
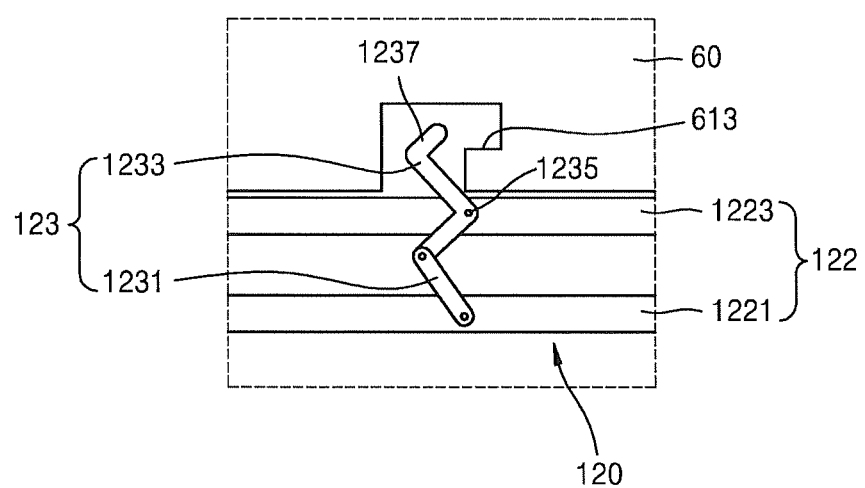
FIGS. 9 and 10 are views for describing a stage according to embodiments.
Figure 10:
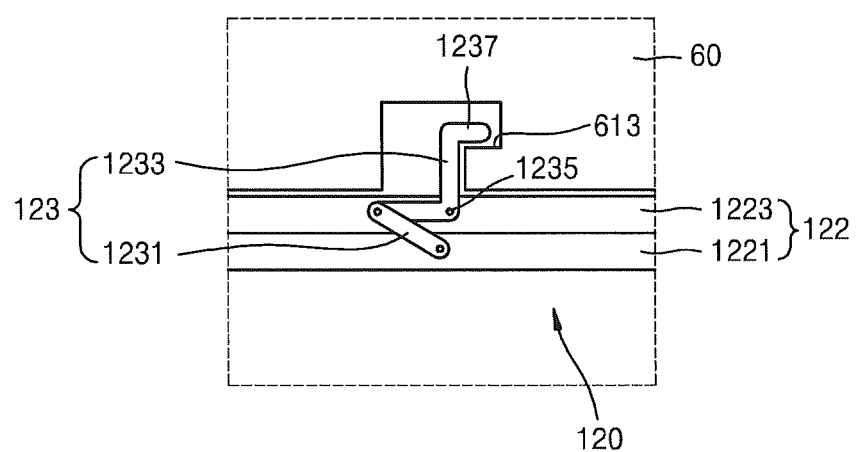

FIGS. 9 and 10 are views for describing the stage 120 according to embodiments.

Referring to FIGS. 9 and 10, the stage 120 may include a plate 122 on which the substrate container 60 is placed and a locking lever 123 mounted on the plate 122. The locking lever 123 for fixing the substrate container 60 may be configured to switch between a fixing position at which the substrate container 60 is fixed and a releasing position at which the substrate container 60 is released. For example, the locking lever 123 may be configured to fix the substrate container 60 by being engaged by a protrusion 613 of the substrate container 60.

In embodiments, the plate 122 may include an upper plate 1223 on which the substrate container 60 is placed and a lower plate 1221 located under the upper plate 1223, and the locking lever 123 may include a first link 1231 pivotably mounted on the lower plate 1221 and a second link 1233 pivotably mounted on the upper plate 1223. The second link 1233 may be connected to the first link 1231 and may be configured to pivot when the first link 1231 pivots.

A distance between the upper plate 1223 and the lower plate 1221 may be adjustable. For example, the upper plate 1223 may be configured to be raised and/or lowered relative to the lower plate 1221, or the lower plate 1221 may be configured to be raised and/or lowered relative to the upper plate 1223. Alternatively, the raising and/or lowering of the upper plate 1223 and the raising and/or lowering of the lower plate 1221 may be performed together. In this case, as shown in FIGS. 9 and 10, as the distance between the upper plate 1223 and the lower plate 1221 is adjusted, the locking lever 123 may be configured to switch between the fixing position and the releasing position.

A process of fixing the substrate container 60 to the stage 120 will now be described with reference to FIGS. 9 and 10. First, as the distance between the lower plate 1221 and the upper plate 1223 decreases, the first link 1231 may pivot in a first pivoting direction (e.g., counterclockwise). When the first link 1231 pivots, the second link 1233 may pivot in a second pivoting direction (e.g., clockwise) that is opposite to the first pivoting direction about a pivoting shaft 1235 coupled to the upper plate 1223. The second link 1233 may pivot to the fixing position for fixing the substrate container 60, and an upper portion of the second link 1233 may be engaged with a protrusion 613 to fix the substrate container 60. The upper portion of the second link 1233 that is engaged with the protrusion 613 of the substrate container 60 may have a shape suitable to be engaged with the protrusion 613. For example, the upper portion of the second link 1233 may include a hook structure 1237 to be engaged with the protrusion 613.

Also, a process of releasing the substrate container 600 will now be described. First, as the distance between the lower plate 1221 and the upper plate 1223 increases, the first link 1231 may pivot in the second pivoting direction. When the first link 1231 pivots, the second link 1233 may pivot in the first pivoting direction about the pivoting shaft 1235 coupled to the upper plate 1223. The second link 1233 may pivot from the fixing position to the releasing position, and the upper portion of the second link 1233 may be separated from the protrusion 613 to release the substrate container 60.

Figure 11:
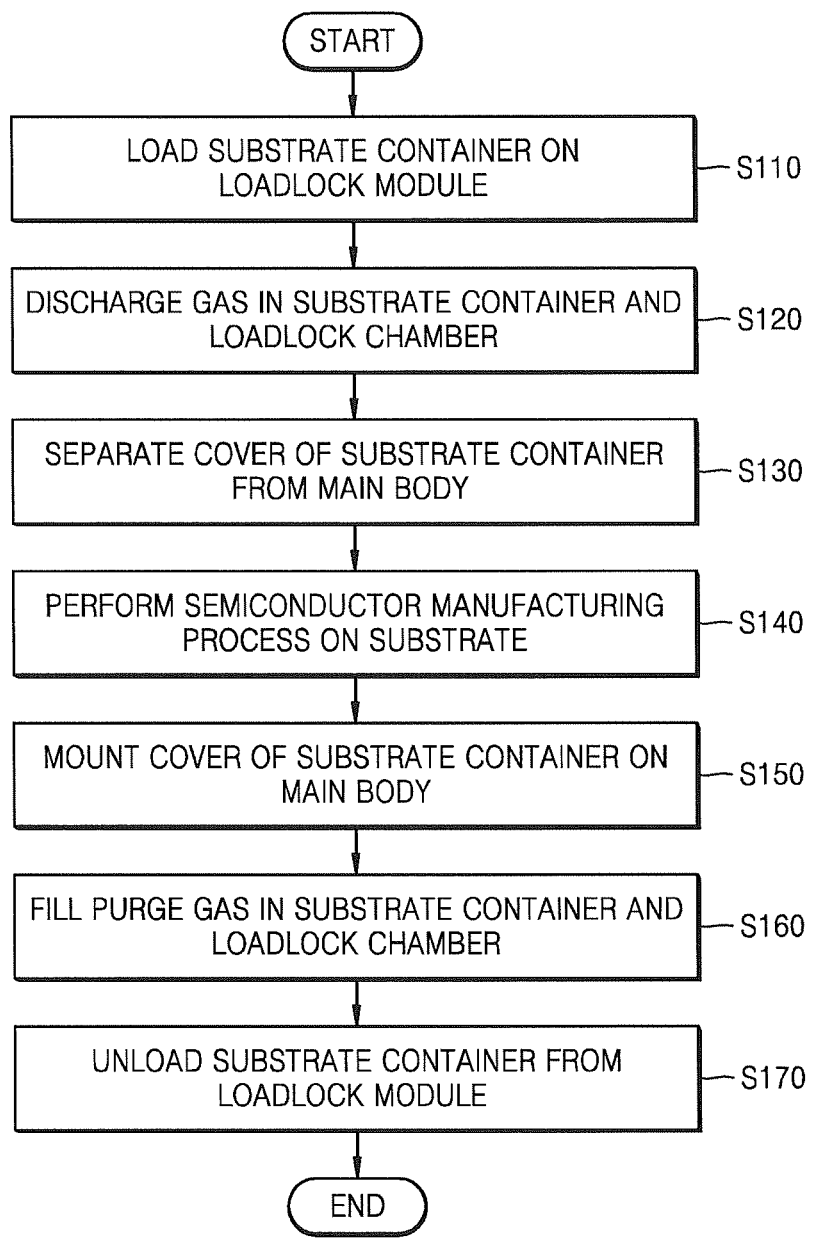
FIG. 11 is a flowchart of a method of processing a substrate by using the semiconductor manufacturing apparatus according to embodiments.

FIG. 11 is a flowchart of a method of processing a substrate by using the semiconductor manufacturing apparatus 1 according to embodiments. FIGS. 12A through 12E are views sequentially illustrating the method of processing the substrate by using the semiconductor manufacturing apparatus 1 according to embodiments. The method of processing the substrate by using the semiconductor manufacturing apparatus 1 will now be described with reference to FIGS. 11 and 12A through 12E.

Referring to FIG. 11, in operation S110, the substrate container 60 in which a plurality of substrates are received is loaded on the loadlock module 10.

As shown in FIG. 2B, the door 115 may open the opening 113 of the loadlock chamber 110, and the substrate container 60 may be placed on the stage 120 in the loadlock chamber 110 by the transfer mechanism 70 such as an overhead hoist transport system. The substrate container 60 may be aligned with a preset position on the stage 120 and may be fixed to the stage 120. When the substrate container 60 is loaded on the loadlock module 10, the door 115 may close the opening 113 to separate the inner space 111 of the loadlock chamber 110 from the outside of the loadlock chamber 110.

Figure 12A:
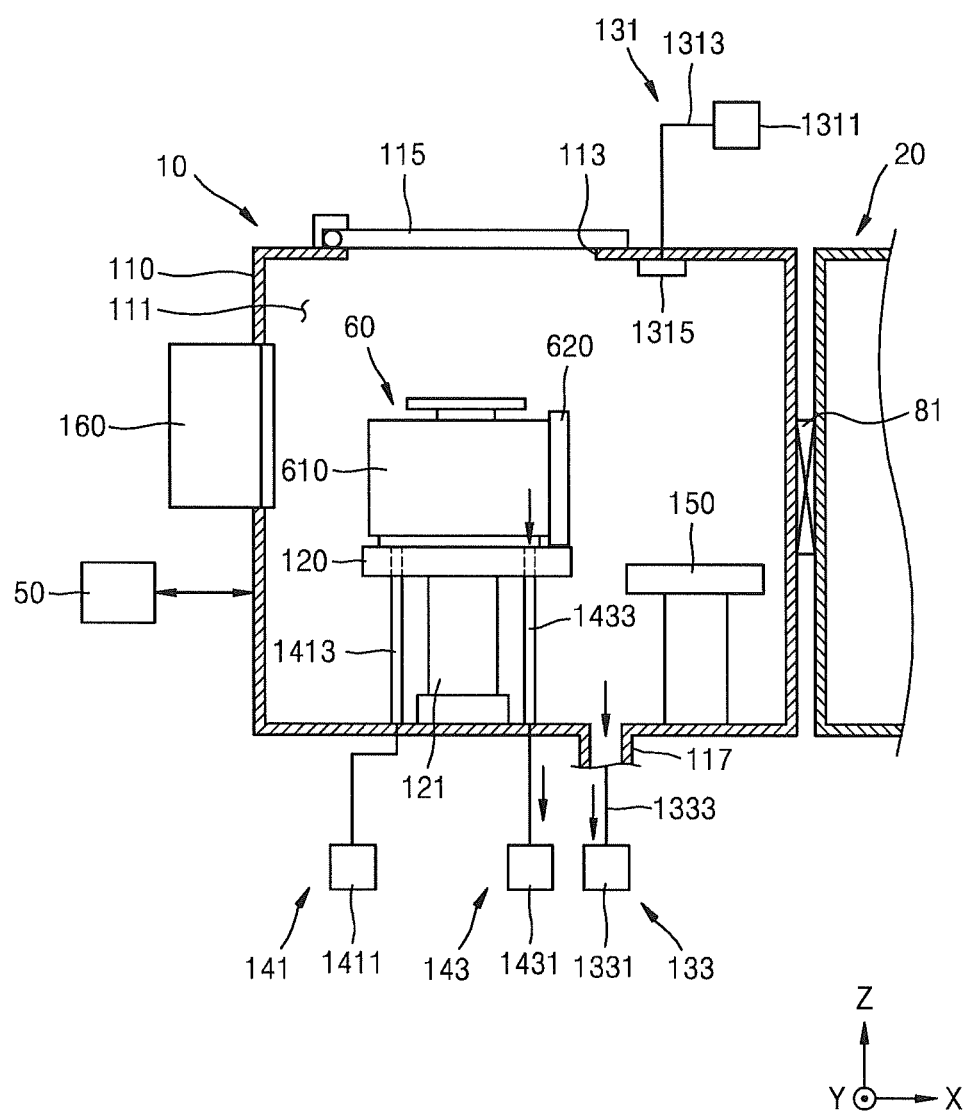
FIGS. 12A through 12E are views sequentially illustrating the method of processing the substrate by using the semiconductor manufacturing apparatus according to embodiments.

Referring to FIGS. 11 and 12A, in operation S120, a gas in the substrate container 60 and a gas in the loadlock chamber 110 are discharged so that each of an internal pressure of the substrate container 60 and an internal pressure of the loadlock chamber 110 becomes a vacuum.

In detail, the first exhaust unit 133 discharges the gas in the loadlock chamber 110 so that the internal pressure of the loadlock chamber 110 is switched from atmospheric pressure to a vacuum, and the second exhaust unit 143 discharges the gas in the substrate container 60 so that the internal pressure of the substrate container 60 is switched from atmospheric pressure to a vacuum. In this case, the controller 50 may detect the internal pressure of the loadlock chamber 110 and the internal pressure of the substrate container 60 so that the internal pressure of the loadlock chamber 110 and the internal pressure of the substrate container 60 are balanced with each other, and may adjust an exhaust speed and/or an exhaust amount by the first exhaust unit 133 and may control an exhaust amount and/or an exhaust speed by the second exhaust unit 143 based on detected information.

Figure 12B:
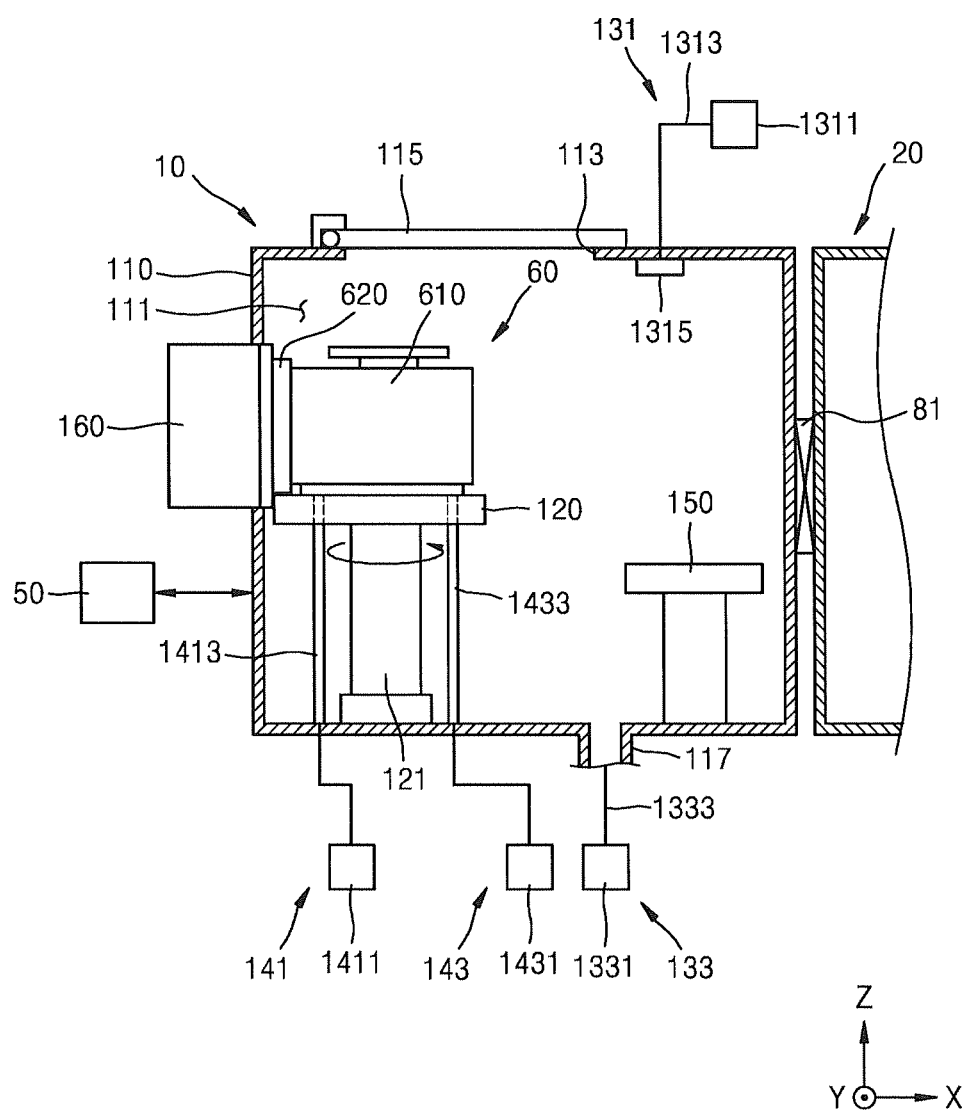
Figure 12C:
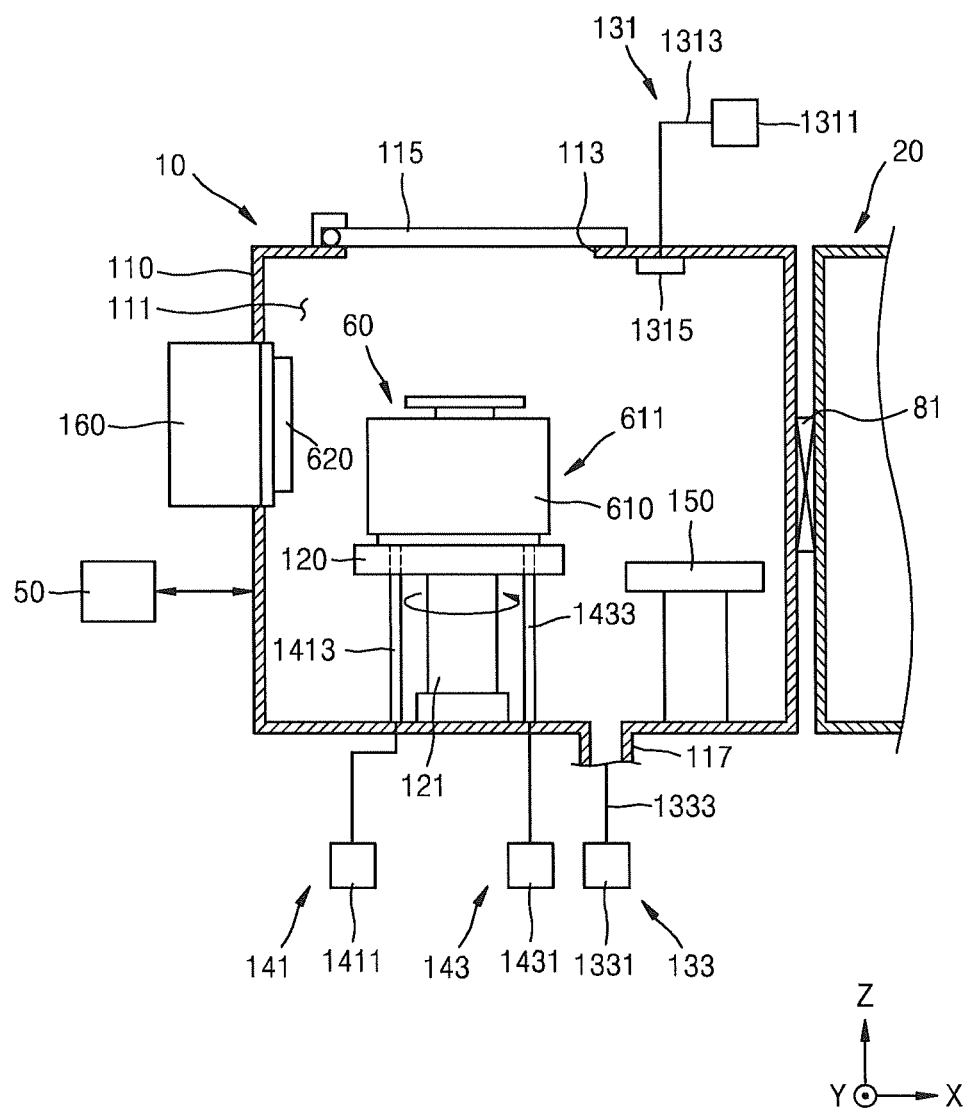

Referring to FIGS. 11, 12B, and 12C, in operation S130, the cover 620 of the substrate container 60 is separated from the main body 610 when the internal pressure of the loadlock chamber 110 and the internal pressure of the substrate container 60 are balanced with a preset pressure of the vacuum.

In detail, as shown in FIG. 12B, the stage 120 may move the substrate container 60 so that the cover 620 of the substrate container 60 contacts the cover holder 160. In this case, the stage 120 may rotate so that the cover 620 of the substrate container 60 faces an inner surface of the loadlock chamber 110 in which the cover holder 160 is provided and may vertically and horizontally move so that the cover 620 contacts the cover holder 160. As shown in FIG. 7, when the cover 620 of the substrate container 60 contacts the cover holder 160 due to the movement of the stage 120, the latch key 161 may drive a cover locking device of the substrate container 60 so that the cover 620 is in an unlock state, and the fixed pad 1633 may expand to be fixed to the groove 621 of the cover 620. As shown in FIG. 12C, when the main body 610 is moved away from the cover holder 160 by the stage 120, the cover 620 may be separated from the main body 610 and may be fixed to the cover holder 160, and an opening 611 of the substrate container 60 may be opened.

Figure 12D:
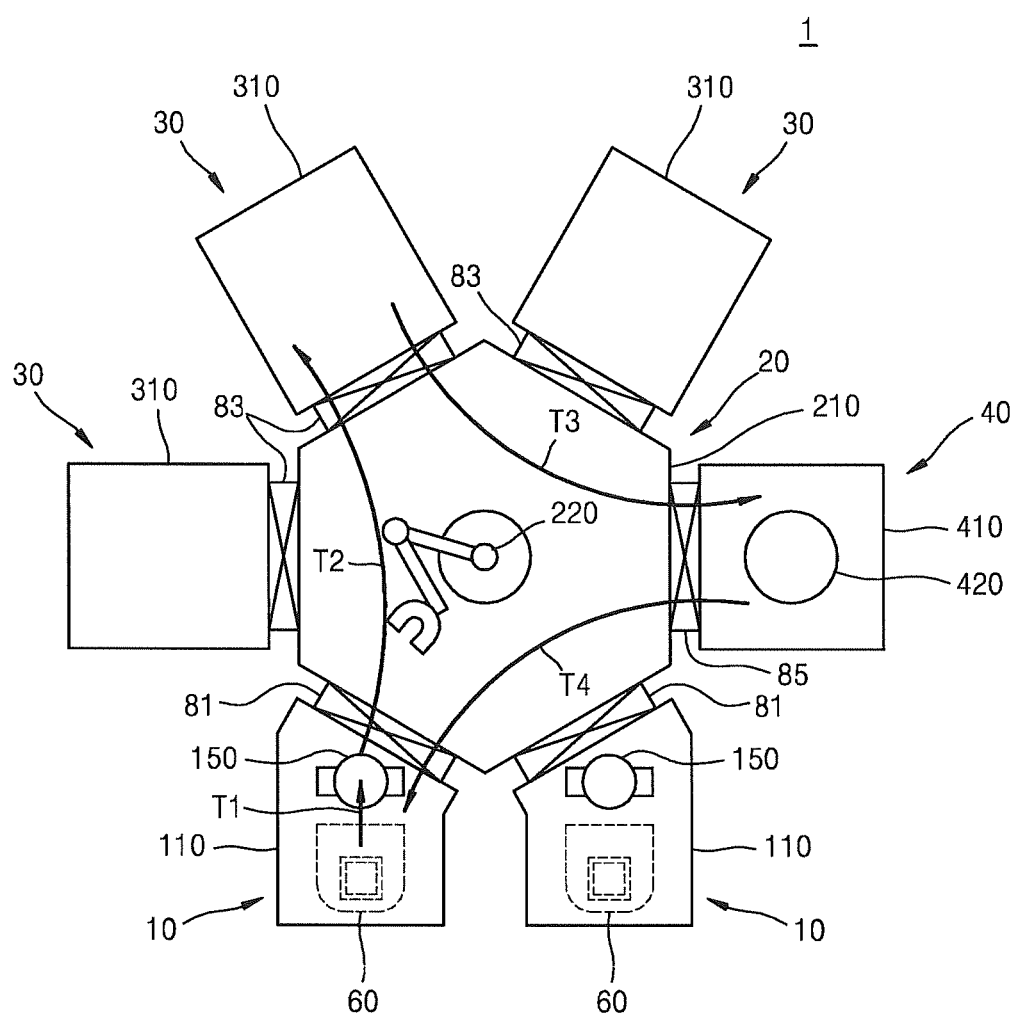

Referring to FIGS. 11 and 12D, in operation S140, the cover 620 of the substrate container 60 is separated from the main body 610, and then a semiconductor manufacturing process is performed on a substrate.

In detail, the transfer module 20 may perform a first transfer operation T1 of transporting the substrate from the substrate container 60 placed on the stage 120 to the substrate aligner 150, and the substrate aligner 150 may align the substrate in a preset direction.

When the aligning of the substrate is completed, the transfer module 20 performs a second transfer operation T2 of transferring the substrate from the substrate aligner 150 to the process module 30. The process module 30 may perform the semiconductor manufacturing process, e.g., an etching process, a deposition process, or a cleaning process, on the substrate.

When the semiconductor manufacturing process performed by the process module 30 is completed, the transfer module 20 performs a third transfer operation T3 of transferring the substrate from the process module 30 to the buffer module 40. The buffer module 40 may remove a gas emitted through outgassing from the substrate by forming a vacuum in the buffer chamber 410.

Next, the process module 30 may perform a fourth transfer operation T4 of transferring the substrate from the buffer module 40 to the substrate container 60 in the loadlock chamber 110.

In operation S150, when the semiconductor manufacturing process is completed on substrates and all of the substrates are accommodated in the substrate container 60, the cover 620 of the substrate container 60 is mounted on the main body 610 to close an opening of the substrate container 60.

In detail, the stage 120 may move the substrate container 60 so that the main body 610 of the substrate container 60 contacts the cover 620 supported on the cover holder 160. As shown in FIG. 5, the latch key 161 may drive the cover locking device of the substrate container 60 so that the cover 620 is in a lock state where the cover 620 is mounted on the main body 610, and the fixed pad 1633 may contract so that the cover 620 is separable from the cover holder 160. Next, as the stage 120 is moved away from the cover holder 160, the cover 620 mounted on the main body 610 may be moved along with the stage 120 and may be separated from the cover holder 160.

Figure 12E:
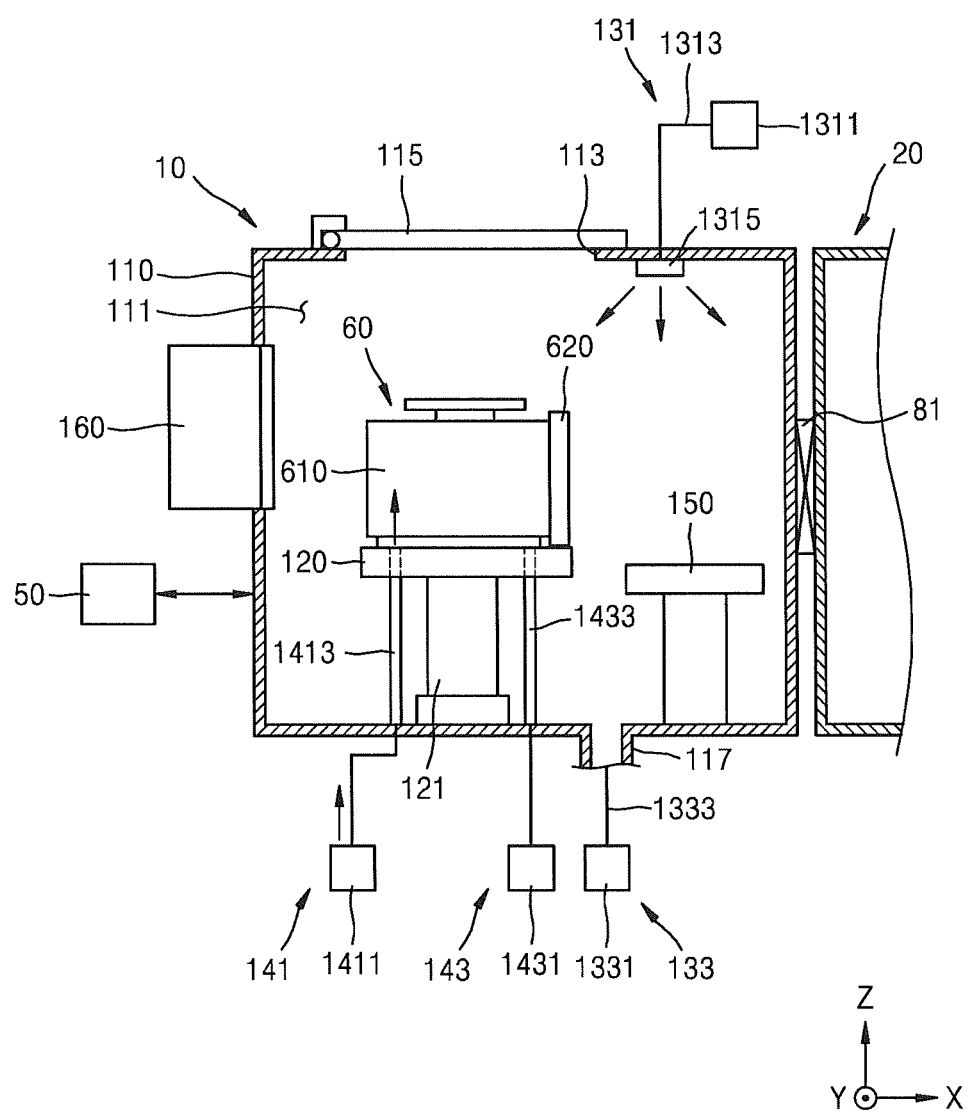

Referring to FIGS. 11 and 12E, in operation S160, after the cover 620 of the substrate container 60 is mounted on the main body 610, a purge gas is filled in the substrate container 60 and the loadlock chamber 110.

In detail, the first purge gas supply unit 131 supplies a purge gas into the loadlock chamber 110 so that the internal pressure of the loadlock chamber 110 is switched from a vacuum to atmospheric pressure, and the second purge gas supply unit 141 supplies a purge gas into the substrate container 60 so that the internal pressure of the substrate container 60 is switched from a vacuum to the atmospheric pressure. In this case, the controller 50 may detect the internal pressure of the loadlock chamber 110 and the internal pressure of the substrate container 60 so that the internal pressure of the loadlock chamber 110 and the internal pressure of the substrate container 60 are balanced with each other, and may adjust a supply amount and/or a supply speed by the first purge gas supply unit 131 and may control a supply amount and/or a supply speed by the second purge gas supply unit 141 based on detected information.

In operation S170, when each of the internal pressure of the substrate container 60 and the internal pressure of the loadlock chamber 110 is switched to the atmospheric pressure, the substrate container 60 is unloaded from the loadlock module 10. As shown in FIG. 2B, the door 115 may open the opening 113 of the loadlock chamber 110, and the transfer mechanism 70 may hold the substrate container 60 on the stage 120 and may take the substrate container 60 out from the loadlock chamber 110.

While the inventive concept has been particularly shown and described with reference to embodiments thereof by using specific terms, the embodiments and terms have merely been used to explain the inventive concept and should not be construed as limiting the scope of the inventive concept as defined by the claims. It will be understood by one of ordinary skill in the art that various modifications and equivalent other embodiments may be made from the inventive concept. Accordingly, the true technical scope of the inventive concept is defined by the technical spirit of the appended claims.

What is claimed is:

1. A substrate processing method comprising:
loading a container containing a substrate in a loadlock chamber of a loadlock module;
a first pressure switching operation of switching a first internal pressure of the container and a second internal pressure of the loadlock chamber from an atmospheric pressure to vacuum;
separating a cover of the container from a main body of the container;
transferring the substrate contained in the container to a process module;
performing a semiconductor manufacturing process on the substrate;
transferring the substrate on which the semiconductor manufacturing process is completed into the container;
mounting the cover of the container on the main body;
a second pressure switching operation of switching the first internal pressure of the container and the second internal pressure of the loadlock chamber from the vacuum to the atmospheric pressure; and
unloading the container from the loadlock module,
wherein the loadlock module comprises:
a first purge gas supply unit configured to supply a first purge gas to an inside of the container through a gas inlet of the container;
a first exhaust unit configured to exhaust a gas in the inside of the container through a gas outlet of the container;
a second purge gas supply unit configured to supply a second purge gas to an inside of the loadlock chamber;
a second exhaust unit configured to exhaust a gas in the inside of the loadlock chamber through an exhaust port of the loadlock chamber; and
a cover holder configured to separate the cover from the main body and support the cover, and
wherein, in the first pressure switching operation and the second pressure switching operation, the first internal pressure of the container and the second internal pressure of the loadlock chamber are adjusted to be balanced with each other, and
wherein the loadlock chamber comprises a first side surface on which the cover holder is arranged, and a second side surface on which a gate for opening and closing a path between the loadlock chamber and a transfer chamber is arranged,
the loadlock module further comprises a stage on which the container is mounted,
the separating of the cover of the container from the main body of the container comprises rotating the stage so that the cover of the container faces the first side surface of the loadlock chamber, and after the separating of the cover of the container from the main body of the container, the stage rotates such that an opening of the main body faces the second side surface of the loadlock chamber.

2. The substrate processing method of claim 1, wherein, in separating the cover of the container from the main body of the container, the cover is separated from the main body when the first internal pressure of the container and the second internal pressure of the loadlock chamber are both switched to vacuum.

3. The substrate processing method of claim 1, wherein, in the first pressure switching operation, the second exhaust unit adjusts the second internal pressure of the loadlock chamber such that the second internal pressure of the loadlock chamber is switched from the atmospheric pressure to the vacuum, and
while the second internal pressure of the loadlock chamber is switched from the atmospheric pressure to the vacuum, the first exhaust unit adjusts the first internal pressure of the container such that the first internal pressure of the container is balanced with the second internal pressure of the loadlock chamber.

4. The substrate processing method of claim 1, wherein, in the second pressure switching operation, the second purge gas supply unit adjusts the second internal pressure of the loadlock chamber such that the second internal pressure of the loadlock chamber is switched from the vacuum to the atmospheric pressure, and
while the second internal pressure of the loadlock chamber is switched from the vacuum to the atmospheric pressure, the first purge gas supply unit adjusts the first internal pressure of the container such that the first internal pressure of the container is balanced with the second internal pressure of the loadlock chamber.

5. The substrate processing method of claim 1, further comprising, after performing of the semiconductor manufacturing process on the substrate, transferring the substrate on which the semiconductor manufacturing process is completed, to a buffer chamber with vacuum inside.

6. The substrate processing method of claim 5, wherein an internal pressure of the buffer chamber is less than an internal pressure of a transfer chamber connected to the buffer chamber and including a transfer robot for transferring the substrate.

7. The substrate processing method of claim 1, further comprising, after the separating of the cover of the container from the main body of the container, transferring the substrate to a substrate aligner provided in the loadlock chamber and aligning the substrate by using the substrate aligner.

8. The substrate processing method of claim 7, wherein the substrate aligner is arranged between the stage and the second side surface of the loadlock chamber.

9. The substrate processing method of claim 1, wherein the cover holder comprises a post inserted into a groove of the cover, and a fixed pad provided on the post and configured to expand or contract, and
in the separating of the cover of the container from the main body of the container, the cover holder expands the fixed pad such that the fixed pad is fixed to the groove of the cover.

10. The substrate processing method of claim 1, wherein, while the semiconductor manufacturing process is performed on the substrate, the first internal pressure of the container and the second internal pressure of the loadlock chamber are maintained in vacuum.

11. The substrate processing method of claim 1, wherein the loadlock chamber comprises an opening through which the container is carried in and out, and a door configured to open and close the opening, and
in the unloading of the container from the loadlock module, the door opens the opening of the loadlock chamber after the first internal pressure of the container and the second internal pressure of the loadlock chamber are both switched to the atmospheric pressure.

12. A substrate processing method comprising:
loading a container containing a substrate in a loadlock chamber of a loadlock module;
a first pressure switching operation of switching a first internal pressure of the container and a second internal pressure of the loadlock chamber from an atmospheric pressure to vacuum;
separating a cover of the container from a main body of the container;
transferring the substrate contained in the container to a process module;
performing a semiconductor manufacturing process on the substrate;
transferring the substrate on which the semiconductor manufacturing process is completed to the container;
mounting the cover of the container on the main body;
a second pressure switching operation of switching the first internal pressure of the container and the second internal pressure of the loadlock chamber from the vacuum to the atmospheric pressure; and
unloading the container from the loadlock module,
wherein, in the separating of the cover of the container from the main body of the container, the cover is separated from the main body when the first internal pressure of the container and the second internal pressure of the loadlock chamber are both switched to the same vacuum,
wherein the loadlock module comprises:
a cover holder configured to separate the cover from the main body and support the cover; and
a stage on which the container is mounted, and
wherein the loadlock chamber comprises a first side surface on which the cover holder is arranged, and a second side surface on which a gate for opening and closing a path between the loadlock chamber and a transfer chamber is arranged,
the separating of the cover of the container from the main body of the container comprising rotating the stage so that the cover of the container faces the first side surface of the loadlock chamber, and
after the separating of the cover of the container from the main body of the container, the stage rotates such that an opening of the main body faces the second side surface of the loadlock chamber.

13. The substrate processing method of claim 12, wherein the loadlock module comprises:
a first purge gas supply unit configured to supply a first purge gas to an inside of the container through a gas inlet of the container;
a first exhaust unit configured to exhaust a gas in the inside of the container through a gas outlet of the container;
a second purge gas supply unit configured to supply a second purge gas to an inside of the loadlock chamber; and
a second exhaust unit configured to exhaust a gas in the inside of the loadlock chamber through an exhaust port of the loadlock chamber.

14. The substrate processing method of claim 13, wherein, in the first pressure switching operation, the second exhaust unit adjusts the second internal pressure of the loadlock chamber such that the second internal pressure of the loadlock chamber is switched from the atmospheric pressure to the vacuum, and while the second internal pressure of the loadlock chamber is switched from the atmospheric pressure to the vacuum, the first exhaust unit adjusts the first internal pressure of the container such that the first internal pressure of the container is balanced with the second internal pressure of the loadlock chamber.

15. The substrate processing method of claim 13, wherein, in the second pressure switching operation, the second purge gas supply unit adjusts the second internal pressure of the loadlock chamber such that the second internal pressure of the loadlock chamber is switched from the vacuum to the atmospheric pressure, and while the second internal pressure of the loadlock chamber is switched from the vacuum to the atmospheric pressure, the first purge gas supply unit adjusts the first internal pressure of the container such that the first internal pressure of the container is balanced with the second internal pressure of the loadlock chamber.

16. The substrate processing method of claim 12, further comprising, after the separating of the cover of the container from the main body of the container, transferring the substrate to a substrate aligner provided in the loadlock chamber and aligning the substrate by using the substrate aligner, and after performing of the semiconductor manufacturing process on the substrate, transferring the substrate on which the semiconductor manufacturing process is completed, to a buffer chamber with vacuum inside.

17. A substrate processing method comprising:

loading a container containing a substrate in a loadlock chamber of a loadlock module;

a first pressure switching operation of switching a first internal pressure of the container and a second internal pressure of the loadlock chamber from an atmospheric pressure to vacuum;

separating a cover of the container from a main body of the container;

transferring the substrate contained in the container to a process module;

performing a semiconductor manufacturing process on the substrate;

transferring the substrate on which the semiconductor manufacturing process is completed to the container;

mounting the cover of the container on the main body;

a second pressure switching operation of switching the first internal pressure of the container and the second internal pressure of the loadlock chamber from the vacuum to the atmospheric pressure; and unloading the container from the loadlock module, wherein, in the first pressure switching operation and the second pressure switching operation, the first internal pressure of the container and the second internal pressure of the loadlock chamber are adjusted to be balanced with each other, in separating the cover of the container from the main body of the container, the cover is separated from the main body when the first internal pressure of the container and the second internal pressure of the loadlock chamber are both switched to the same vacuum, and wherein the loadlock module comprises:

a cover holder configured to separate the cover from the main body and support the cover; and a stage on which the container is mounted, and wherein the loadlock chamber comprises a first side surface on which the cover holder is arranged, and a second side surface on which a gate for opening and closing a path between the loadlock chamber and a transfer chamber is arranged, the separating of the cover of the container from the main body of the container comprising rotating the stage so that the cover of the container faces the first side surface of the loadlock chamber, and after the separating of the cover of the container from the main body of the container, the stage rotates such that an opening of the main body faces the second side surface of the loadlock chamber.

* * * * *